United States Patent [19]

Longacre, Jr.

[11] 3,736,527

[45] May 29, 1973

[54] PRECISION VOLTAGE BIAS FOR JOSEPHSON OSCILLATORS

[75] Inventor: Andrew Longacre, Jr., Rochester, N.Y.

[73] Assignee: The United States of America as represented by the Secretary of the Navy, Washington, D.C.

[22] Filed: Sept. 21, 1972

[21] Appl. No.: 291,125

[52] U.S. Cl.............331/107 S, 307/306, 317/235 N, 321/61, 323/8, 331/65, 331/186

[51] Int. Cl...............................................H03b 3/04

[58] Field of Search.....................331/107 S, 186, 65; 317/235 N; 323/7, 8; 321/60, 61, 69; 307/306

[56] References Cited

UNITED STATES PATENTS

| | | | |
|---|---|---|---|
| 3,363,200 | 1/1968 | Jaklevic et al. | 331/107 S X |
| 3,696,287 | 10/1972 | Silver et al. | 307/306 X |

*Primary Examiner*—Roy Lake
*Assistant Examiner*—Siegfried H. Grimm
*Attorney*—R. S. Sciascia and L. I. Shrago

[57] ABSTRACT

A Josephson junction irradiated with signal energy of frequency *f* and current biased to a particular radio frequency induced step in its I-V characteristic is employed as a voltage standard to precisely voltage bias a second Josephson junction so as to have its AC oscillations occur at a selected harmonic of said frequency *f*. A SLUG is utilized in the control circuit which automatically equalizes the voltages across these junctions.

6 Claims, 2 Drawing Figures

PRECISION VOLTAGE BIAS FOR JOSEPHSON OSCILLATORS

The present invention relates generally to control circuits for superconducting devices and, more particularly, to apparatus for, and a method of, precisely biasing a Josephson junction so as to have its AC current of a particular frequency.

The proposed use of the Josephson junction as a source of AC oscillations for hetrodyne frequency conversion requires that the junction be biased with a precisely determined voltage. Since the frequency of the AC Josephson current is directly proportional to the impressed voltage, and since this frequency changes by about 483 $GH_z$ per microvolt of bias, any instability or variation in this bias would seriously affect the mixing operation.

It is well known that when a Josephson junction is irradiated with microwave energy current steps are produced in its voltage versus current characteristic, and these steps occur at voltages exactly proportional to the applied microwave frequency via the relationship $V = n \times hf/2e$, where n is an integer, $h$ = Planck's constant and $e$ is the electron charge. Consequently, an irradiated Josephson junction may be considered a voltage standard as accurate as one knows the irradiating frequency and/or the ratio of the fundamental constants $e/h$.

The present invention utilizes the above relationship in order to obtain a precise voltage bias for a Josephson junction. More particularly, the bias technique herein disclosed employs one Josephson junction as a voltage standard and the voltage across a second Josephson junction is compared with this standard and automatically adjusted until equality is established.

It is, accordingly, a primary object of the present invention to provide a method of and an apparatus for precisely biasing a Josephson junction so as to have its AC oscillations occur at a pre-selected frequency.

Another object of the present invention is to provide a biasing technique for a Josephson junction which employs the voltage across a second Josephson junction which is irradiated with microwave energy of a known frequency as a voltage standard for comparison purposes.

Another object of the present invention is to provide a system for biasing a Josephson junction wherein a SLUG is used as a current detecting means in a re-balancing circuit which equalizes the voltage across this junction and the voltage across a second junction irradiated with microwave energy of a known frequency.

Figure 1:
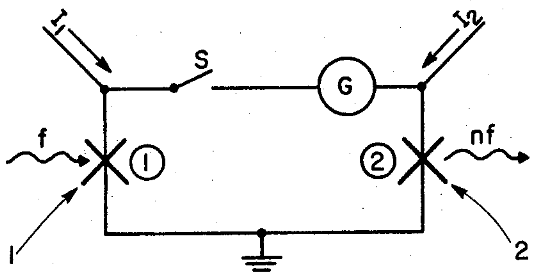
Figure 2:
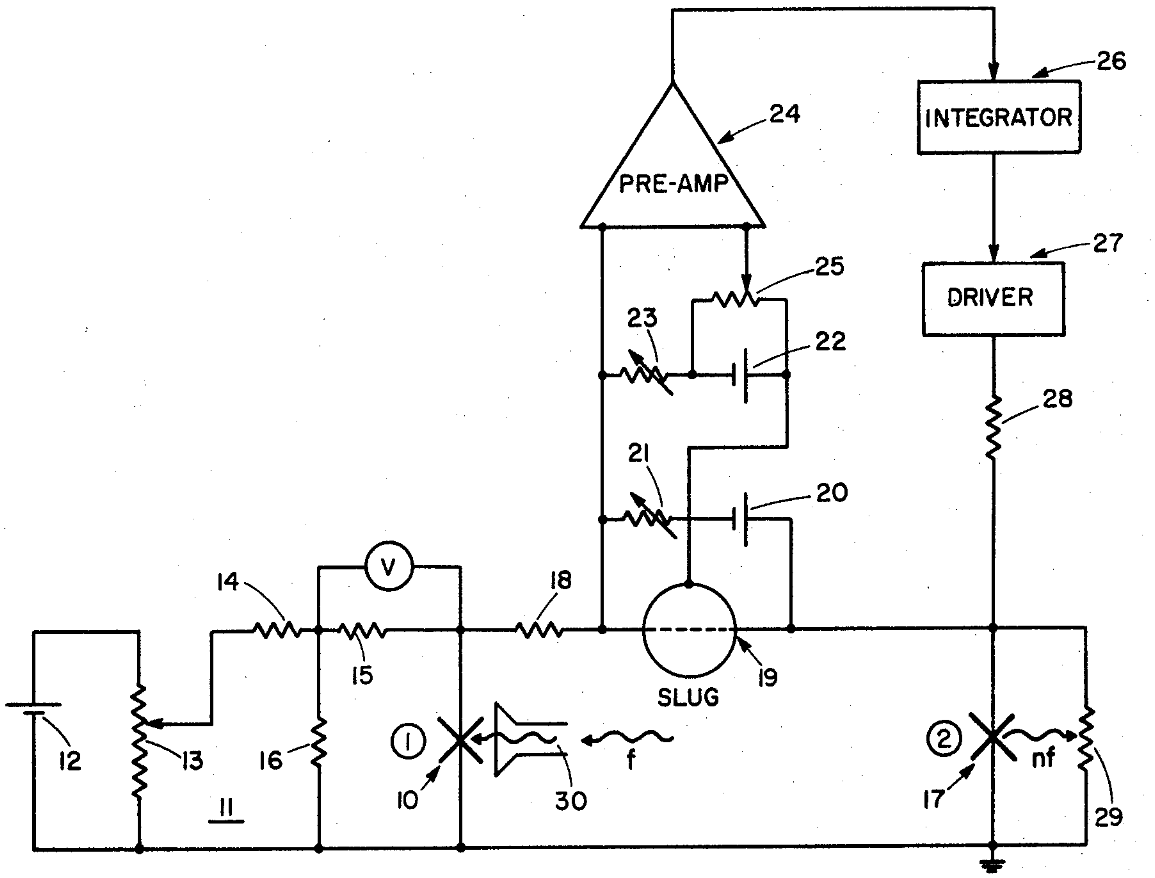

Other objects, advantages and novel features of the invention will become apparent from the following detailed description of the invention when considered in conjunction with the accompanying drawings wherein:

FIG. 1 is a simplified circuit which demonstrates the operating principle of the present invention; and FIG. 2 is a schematic diagram of one preferred embodiment of the invention wherein the re-balancing circuit utilizes a SLUG as a current detecting means.

Referring now to FIG. 1 which shows a simple arrangement that illustrates the operating principle of the present invention, it will be seen that the circuit includes a first Josephson junction 1 which is irradiated with microwave energy of frequency f. This junction has a DC current $I_1$ flowing therethrough whose magnitude may be varied by any known technique. With switch S open, this current is adjusted so that junction 1 is biased to one of the radio frequency induced steps in the I-V characteristic mentioned hereinbefore. The voltage across junction 1 will therefore be equal to $nhf/2e$.

The circuit includes a second Josephson junction 2, the junction that is to be precisely biased. A DC current $I_2$ of controllable magnitude is adapted to flow through this junction. After the current $I_1$ is properly established, switch S is closed, and the magnitude of current $I_2$ is adjusted until no current flow is observed in galvanometer G connected between the two junctions. It will be appreciated when this condition exists the voltage bias of junction 2 equals that of junction 1, namely, $nhf/2e$ and the frequency of the AC Josephson oscillations of junction 2 equals a harmonic $nf$ of the applied frequency $f$.

FIG. 2 illustrates one embodiment of the present invention wherein the voltages across the two Josephson junctions, that is, the irradiated junction and the junction that is to be controlled are compared and a SLUG detects any error signal due to a voltage imbalance therebetween. This SLUG is associated with a control circuit which automatically equalizes the two voltages.

More particularly, Josephson junction 10 has a bias circuit 11 which includes a DC source of voltage 12 and a potentiometer 13 connected thereacross. The movable tap of this potentiometer is connected to a T-network of resistors 14, 15 and 16. In one particular embodiment, series arm resistor 14 was 100 ohms, while the other series arm 15 and shunt arm 16 were 1 ohm. It will be appreciated that by varying the setting of potentiometer 13, the current flow through junction 10 may be controlled. This current may be considered the equivalent of current $I_1$ hereinbefore described in connection with FIG. 1. The magnitude of this current may be monitored by any suitable microvoltmeter placed in parallel with resistor 15.

A suitable source of microwave energy of frequency f is coupled to a waveguide assembly 30 equipped with a horn for irradiating junction 10. Because of this irradiation, as mentioned hereinbefore, steps occur in the I-V characteristic of this junction, with the horizontal portion of each step delineating an operating point of constant voltage. The magnitude of these various voltages may be determined by the relationship previously set forth.

Irradiated Josephson junction 10 is the voltage standard of the system. The voltage across it may be known to the same degree of accuracy as frequency $f$ is known and the ratio of the fundamental constants $e/h$.

The circuit also contains a second Josephson junction 17, and this is the junction which is to be precisely biased so as to have its AC oscillations occur at a preselected frequency, which frequency may be any harmonic of frequency $f$. Junctions 10 and 17 are interconnected by the series combination of resistor 18 and SLUG 19.

The SLUG, a superconducting device invented by John Clarke, consists of a blob of lead-tin solder around a niobium wire. The critical current of this device shows a periodic behavior as a function of the current passing through the niobium wire. It may be used to detect current changes of $10^{-8}$ amperes. SLUG is an acronym for superconducting low-inductance undulating galvanometer.

SLUG 19 has associated with it a DC source 20 and a variable resistor 21 which are connected in series across the blob and the niobium wire. It also has a second DC source 22 and a second variable resistor 23 also connected in series between the blob of solder and one side of the niobium wire. The aforementioned DC sources and resistors form a biasing circuit whose purpose is to have SLUG 19 operate in a region of maximum sensitivity. With SLUG 19 appropriately biased, any change in the current flow through it will be reflected in the input voltage at preamplifier 24. Resistor 18, which has a very small value, serves to decouple the superconducting states of the two Josephson junctions.

While the particular circuit for biasing SLUG 19 is a matter of choice, it would be pointed out that in the arrangement shown, battery 22 and variable resistance 23 in series therewith serve to current bias the SLUG at a steep point in its I-V curve so that the imbalanced current passing along the niobium wire which modulates the peak zero-voltage current is accompanied by a shift in the bias voltage. Potentiometer 25 is adjusted to this bias and amplifier 24 amplifies the difference between these voltages. Battery 20 and variable resistance 21 provide a "pre-biasing" current $I_{pb}$ through the niobium wire so that any additional change in wire current caused by an imbalance of the circuit modulates the peak zero-bias current in a direction dependent upon the direction of the imbalance. Thus, the error signal and the correction are always in the proper direction.

It will be appreciated that when the voltages across junctions 10 and 17 are equal, there will be no current flow through series resistor 18 and SLUG 19. However, once this equality is disturbed or is otherwise altered, therewill be a net DC current flow through SLUG 19 in a direction and of a magnitude depending upon the voltage imbalance. With SLUG 19 appropriately biased, extremely small imbalanced current flows may be detected, and this detected current appears as a corresponding voltage signal in the input of preamplifier 24. This amplifier has one terminal connected to the junction of resistor 18 and SLUG 19 and another terminal connected to the movable tap of a potentiometer 25 connected across DC source 22.

The output from preamplifier 24 is fed to an integrator 26 which in turn is coupled to a driver 27. The output of driver 27 is supplied through resistor 28 to one side of a resistor 29 connected in parallel with junction 17.

SLUG 19, preamplifier 24, integrator 26, driver 27 and resistor 28 form a current drive feed-back circuit for automatically balancing the voltages across the two Josephson junctions. Thus, any unbalanced current existing in this circuit and flowing through SLUG 19 develops a current through junction 17 of a magnitude and direction to equalize the two junction voltages and reduce this imbalanced current to zero. The purpose of the low-shunt resistor 29 across junction 17 is to minimize voltage noise and give the appearance of an appropriate voltage biasing source to junction 17.

It would be pointed out, in connection with the biasing method of the present invention, that the frequency of the AC Josephson oscillations in the controlled junction 17, for example, is $nf$, a harmonic of the irradiating microwave energy. Thus, it is possible to generate frequencies of, for example, 750 $GH_z$ by employing a 12.5 $GH_z$ irradiating signal and biasing the irradiated junction to the sixtieth step in the I-V characteristic. Since the lower 12.5 $GH_z$ signal is relatively easy to generate and measure, the present invention provides a highly convenient arrangement for effectively multiplying such a signal up into the 750 $GH_z$ region.

This aspect of the invention is extremely desirable in applications where it is necessary to convert frequencies down from the submillimeter wavelengths in certain detecting systems. Additionally, slow changes in the irradiating frequency will be reflected in the AC oscillations occurring in the second junction and, thus, frequency sweeping may be achieved in a relatively simple manner.

It will be appreciated that the arrangement shown for irradiating junction 1 has been selected for simplicity of illustration. In practice, this junction would, most likely, be mounted across a waveguide as in the manner shown in the article, "Josephson-Effect Far-Infrared Detector" by Grimes et al. which appeared in the July issue of Applied Physics 39,3905 (1968).

What is claimed is:

1. A method of precisely voltage biasing a Josephson junction so as to have its AC oscillations occur at a preselected harmonic of a frequency f comprising the steps of:

irradiating a reference Josephson junction with signal energy of said frequency $f$ while controlling a DC current flow therethrough so as to bias this Josephson junction to a particular one of the constant voltage radio frequency induced steps which occur in the I-V characteristic of an irradiated Josephson junction at voltages equal to $\pm nhf/2e$ where n is an integer, h = Planck's constant and e is the electron charge; and regulating the voltage across a second Josephson junction so as to have this voltage equal the voltage across said reference Josephson junction, wehreby the AC oscillations of said second Josephson junction occur at the frequency $nf$.

2. A system for biasing a Josephson junction so as to have its AC oscillations occur at a pre-selected frequency comprising in combination:

a first reference Josephson junction, means for irradiating said junction with signal energy of a frequency $f$, means for establishing a DC current flow through said irradiated junction such that said junction is current biased to a particular one of the constant voltage radio frequency induced steps which occur in the I-V characteristic of an irradiated Josephson junction at voltages equal to $\pm nhf/2e$ where n is an integer, $h$ = Planck's constant and e is the electron charge;

a second Josephson junction, means for controlling the voltage across said second junction so that it equals the voltage across said first reference junction, whereby the AC oscillations of said second Josephson junction occur at a pre-selected harmonic of said frequency $f$.

3. In an arrangement as defined in claim 2 wherein said means for controlling the voltage across said second junction includes:

means for comparing the voltage across said reference and second junctions and for detecting any imbalance current flow resulting from an inequality of said voltages; and means responsive to said imbalance current for varying a DC current flow through said second junction by an amount and in a direction such as to reduce said imbalance current and equalize said voltages.

4. In an arrangement as defined in claim 3 wherein said means for detecting said imbalance current includes a SLUG and means for biasing said SLUG to a sensitive point in its I-V characteristic.

5. A system for biasing a Josephson junction so as to have its AC oscillations occur at a pre-selected frequency comprising in combination:

a first reference Josephson junction, means for irradiating said junction with signal energy of a frequency *f*, means for biasing said irradiated junction to a particular one of the constant voltage radio frequency induced steps which occur in the I-V characteristic of an irradiated Josephson junction;

a second Josephson junction, a SLUG, said SLUG and second Josephson junction being connected in series across said reference junction, whereby whenever the voltages across these junctions are unequal an imbalance current flows through said SLUG, and means responsive to any such imbalance current for automatically changing the voltage across said second Josephson junction so as to have this voltage correspond to the voltage across said first reference junction, whereby the AC oscillations of said second junction occur at a pre-selected harmonic of frequency f depending upon said particular constant voltage step.

6. In an arrangement as defined in claim 5 wherein said means responsive to said imbalance current for automatically changing the voltage across said second junction includes;

means for biasing said SLUG to a particular voltage bias, said voltage bias changing in response to the imbalance current flow through said SLUG;

an amplifier connected across said SLUG such that the changes in the voltage bias of said SLUG provide the input signal to said amplifier;

an integrator connected to the output of said amplifier; and means controlled by the output of said integrator for adjusting a DC current flow through said second Josephson junction to equalize the voltages across said reference and second junctions.

* * * * *